(12) United States Patent
Dunn et al.

(10) Patent No.: US 8,975,012 B2
(45) Date of Patent: *Mar. 10, 2015

(54) MULTI-LAYER ARTICLES CAPABLE OF FORMING COLOR IMAGES AND METHODS OF FORMING COLOR IMAGES

(75) Inventors: Douglas S. Dunn, Maplewood, MN (US); William Ward Merrill, White Bear Lake, MN (US); Przemyslaw P. Markowicz, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 152 days.

This patent is subject to a terminal disclaimer.

(21) Appl. No.: 13/805,928

(22) PCT Filed: Jun. 30, 2011

(86) PCT No.: PCT/US2011/042478
§ 371 (c)(1),
(2), (4) Date: Dec. 20, 2012

(87) PCT Pub. No.: WO2012/003247
PCT Pub. Date: Jan. 5, 2012

(65) Prior Publication Data
US 2013/0095435 A1    Apr. 18, 2013

Related U.S. Application Data

(60) Provisional application No. 61/360,032, filed on Jun. 30, 2010.

(51) Int. Cl.
*G03C 5/56* (2006.01)
*B41M 5/34* (2006.01)
(Continued)

(52) U.S. Cl.
CPC . *G03F 7/095* (2013.01); *B32B 7/12* (2013.01); *B32B 27/08* (2013.01); *B32B 27/18* (2013.01);
(Continued)

(58) Field of Classification Search
CPC ...... B32B 27/20; B32B 27/304; B32B 27/36; B32B 27/365; B32B 2425/00; B41M 5/46; B41M 2205/04; B41M 5/323; G03C 1/00; G03C 1/732; G03C 5/56; B42D 15/10; B42D 2031/08
See application file for complete search history.

(56) References Cited

U.S. PATENT DOCUMENTS 2,995,466 A    8/1961   Sorensen
3,219,818 A *  11/1965  Luebbe, Jr. .......... 430/348
(Continued)

FOREIGN PATENT DOCUMENTS

DE    2237833    2/1973
GB    2333897    8/1999
(Continued)

OTHER PUBLICATIONS

Sabongi, Chemical Triggering-Reactions of Potential Utility in Industrial Processes, Plenum Press, New York, N.Y. (1987), pp. 68-72.
(Continued)

*Primary Examiner* — Martin Angebrannt
(74) *Attorney, Agent, or Firm* — Jeffrey M. Olofson

(57) ABSTRACT

Multi-layer articles are described that are capable of forming color images. The articles include at least six layers, four thermally activatable layers (layers 1-4) and two blocking layers (layer 5 and 6). The layers are arranged such that layer 5 is disposed between layers 1 and 2 and layer 6 is disposed between layers 3 and 4. Thermally activatable layers 1 and 2 are activatable upon exposure to light of a first write wavelength, and blocking layer 5 is adapted to at least partially block light of the first write wavelength. Thermally activatable layers 3 and 4 are activatable upon exposure to light of a second write wavelength, and blocking layer 6 is adapted to at least partially block light of the second write wavelength. At least one, and possibly all of the thermally activatable layers include a light to heat convertor composition and a color changing compound. Some of the thermally activatable layers may be a group of layers arranged to selectively reflect light by constructive or destructive interference to provide a first reflective characteristic, the group of layers also having a first absorption characteristic suitable to, upon exposure to light comprising a write wavelength, absorptively heat the first group of layers by an amount sufficient to change the first reflective characteristic to a second reflective characteristic while maintaining the structural integrity of the group of layers.

19 Claims, 1 Drawing Sheet

(51) Int. Cl.
  *B41M 5/30* (2006.01)
  *G03F 7/095* (2006.01)
  *B32B 7/12* (2006.01)
  *B32B 27/08* (2006.01)
  *B32B 27/18* (2006.01)
  *B41M 5/42* (2006.01)
  *B41M 5/46* (2006.01)
  *B32B 27/20* (2006.01)
  *B32B 27/32* (2006.01)
  *B32B 27/36* (2006.01)
  *B32B 27/24* (2006.01)
  *B32B 27/40* (2006.01)

(52) U.S. Cl.
  CPC . *B41M 5/34* (2013.01); *B41M 5/42* (2013.01); *B41M 5/46* (2013.01); *B32B 27/20* (2013.01); *B32B 27/32* (2013.01); *B32B 27/36* (2013.01); *B32B 27/365* (2013.01); *B32B 27/24* (2013.01); *B32B 27/40* (2013.01); *B32B 2255/10* (2013.01); *B32B 2255/26* (2013.01); *B32B 2307/4026* (2013.01); *B41M 5/465* (2013.01); *B32B 2307/30* (2013.01); *B32B 2307/41* (2013.01); *B32B 2307/416* (2013.01); *B32B 2307/42* (2013.01); *B32B 2425/00* (2013.01); *B32B 2519/00* (2013.01); *B32B 2554/00* (2013.01)
  USPC .......................... 430/438; 430/502; 430/496

(56) References Cited

U.S. PATENT DOCUMENTS

| | | | |
|---|---|---|---|
| 4,011,352 A | | 3/1977 | Janssens |
| 4,482,625 A | | 11/1984 | Namiki |
| 4,563,415 A | | 1/1986 | Brown |
| 4,619,892 A | * | 10/1986 | Simpson et al. ............. 430/505 |
| 4,670,373 A | | 6/1987 | Kitaguchi |
| 5,178,990 A | | 1/1993 | Satake |
| 5,278,031 A | | 1/1994 | Boggs |
| 5,358,923 A | * | 10/1994 | Mitsuhata et al. ............ 503/227 |
| 5,395,736 A | | 3/1995 | Grasshoff |
| 5,419,999 A | * | 5/1995 | Uejima ........................ 430/290 |
| 5,486,949 A | | 1/1996 | Schrenk |
| 5,554,664 A | | 9/1996 | Lamanna |
| 5,770,737 A | | 6/1998 | Reinhardt |
| 5,857,410 A | | 1/1999 | Watanabe |
| 5,859,251 A | | 1/1999 | Reinhardt |
| 5,882,774 A | | 3/1999 | Jonza |
| 5,914,213 A | | 6/1999 | Grasshoff |
| 6,045,894 A | | 4/2000 | Jonza |
| 6,100,405 A | | 8/2000 | Reinhardt |
| 6,352,761 B1 | | 3/2002 | Hebrink |
| 6,531,230 B1 | | 3/2003 | Weber |
| 6,627,384 B1 | | 9/2003 | Kim |
| 6,830,713 B2 | | 12/2004 | Hebrink |
| 6,939,499 B2 | | 9/2005 | Merrill |
| 6,946,188 B2 | | 9/2005 | Hebrink |
| 6,967,778 B1 | | 11/2005 | Wheatley |
| 7,256,936 B2 | | 8/2007 | Hebrink |
| 7,316,558 B2 | | 1/2008 | Merrill |
| 2002/0197560 A1 | * | 12/2002 | Ichihara ................... 430/270.13 |
| 2003/0035934 A1 | | 2/2003 | Shimomura |
| 2007/0072110 A1 | * | 3/2007 | Iftime et al. ............... 430/270.1 |
| 2008/0049179 A1 | | 2/2008 | Kawamoto |
| 2008/0278811 A1 | | 11/2008 | Perkins |
| 2010/0188959 A1 | * | 7/2010 | Kim et al. ................. 369/110.01 |
| 2013/0095434 A1 | * | 4/2013 | Dunn et al. ................... 430/348 |

FOREIGN PATENT DOCUMENTS

| | | | |
|---|---|---|---|
| JP | S62-231437 | | 10/1987 |
| JP | H09-311217 | | 2/1997 |
| JP | H09-265260 | | 10/1997 |
| JP | 2000-247031 | * | 9/2000 |
| JP | 2004-020596 | * | 1/2004 |
| JP | 2009-137220 | | 6/2009 |
| WO | WO 98-21521 | | 5/1998 |
| WO | WO 99-53242 | | 10/1999 |
| WO | WO 2008-144136 | | 11/2008 |
| WO | WO 2008-144656 | | 11/2008 |
| WO | WO 2009-140088 | | 11/2009 |
| WO | WO 2010-075340 | | 7/2010 |
| WO | WO 2010-075357 | | 7/2010 |
| WO | WO 2010-075363 | | 7/2010 |
| WO | WO 2010-075373 | | 7/2010 |
| WO | WO 2010-075383 | | 7/2010 |
| WO | WO 2012-003215 | | 1/2012 |

OTHER PUBLICATIONS

Schwartz, "Aqueous Dissociation of Squaric Acid", Journal of Physical Chemistry, vol. 74, No. 25, (1970) p. 4374-4377.

Leonard; "The Ultra Violet Absorption Spectra of Alkoxy- and Hydroxybenzils", Journal of American Chemical Society; 71; (1949); pp. 2997-3002.

International Search Report PCT/US2011/042478 mailed on Feb. 9, 2012, 3 pages.

* cited by examiner

МULTI-LAYER ARTICLES CAPABLE OF FORMING COLOR IMAGES AND METHODS OF FORMING COLOR IMAGES

FIELD OF THE DISCLOSURE

The disclosure relates to multi-layer articles capable of forming color images, multi-layer articles containing color images, and methods for generating color images within multi-layer articles.

BACKGROUND

For many applications it is desirable to have articles which contain color images. A variety of techniques have been developed to form color images, including printing techniques and other imaging techniques such as thermal imaging processes.

Among the thermal imaging processes are "thermal transfer" processes in which heat is used to move colored material from a donor sheet to a receiver sheet. Alternatively, heat may be used to convert a colorless coating on a sheet into a colored image in a process called "direct thermal" imaging. Generally in this process a thermal print head is used to address one line of the image at a time.

SUMMARY

Multi-layer articles are described herein that are capable of forming color images. In some embodiments, the multi-layer articles comprise a first, interior, thermally activatable layer, wherein the first thermally activatable layer comprises a first light to heat convertor composition and a first color changing compound, and wherein the light to heat convertor composition absorbs light of a first write wavelength and the first activatable layer has a first absorption threshold for activation, and a second, interior, thermally activatable layer, wherein the second thermally activatable layer comprises a second light to heat convertor composition and a second color changing compound and wherein the light to heat convertor composition absorbs light of the first write wavelength and the second activatable layer has a second absorption threshold for activation, wherein the second absorption threshold is lower than the first absorption threshold, and a first blocking layer disposed between the first and second internal thermally activatable layers, the first blocking layer being adapted to at least partially block light of the first write wavelength, and a third, interior, thermally activatable layer, wherein the third thermally activatable layer comprises a third light to heat convertor composition and a third color changing compound, and wherein the third light to heat convertor composition absorbs light of a second write wavelength and the third activatable layer has a third absorption threshold for activation, and a fourth, interior, thermally activatable layer, wherein the fourth thermally activatable layer comprises a fourth light to heat convertor composition and a fourth color changing compound and wherein the fourth light to heat convertor composition absorbs light of the second write wavelength and the fourth activatable layer has a fourth absorption threshold for activation, wherein the fourth absorption threshold is lower than the third absorption threshold, and a second blocking layer disposed between the third and fourth internal thermally activatable layers, the second blocking layer being adapted to at least partially block light of the second write wavelength.

In other embodiments, the multi-layer articles comprise a first, interior, thermally activatable layer, wherein the first thermally activatable layer absorbs light of a write wavelength and the first activatable layer has a first absorption threshold for activation, and a second, interior, thermally activatable layer, wherein the second thermally activatable layer absorbs light of the first write wavelength and the second activatable layer has a second absorption threshold for activation, wherein the second absorption threshold is lower than the first absorption threshold, and a first blocking layer disposed between the first and second internal thermally activatable layers, the first blocking layer being adapted to at least partially block light of the first write wavelength, and a third, interior, thermally activatable layer, wherein the third thermally activatable layer absorbs light of a second write wavelength and the third activatable layer has a third absorption threshold for activation, and a fourth, interior, thermally activatable layer, wherein the fourth thermally activatable layer absorbs light of the second write wavelength and the fourth activatable layer has a fourth absorption threshold for activation, wherein the fourth absorption threshold is lower than the third absorption threshold, and a second blocking layer disposed between the third and fourth internal thermally activatable layers, the second blocking layer being adapted to at least partially block light of the second write wavelength, and wherein at least one of the first, second, third or fourth activation layers comprises a light to heat convertor composition and a color changing compound, and at least one of the first, second, third or fourth activation layers comprises a group of layers arranged to selectively reflect light by constructive or destructive interference to provide a first reflective characteristic, the group of layers also having a first absorption characteristic suitable to, upon exposure to light comprising the write wavelength, absorptively heat the first group of layers by an amount sufficient to change the first reflective characteristic to a second reflective characteristic while maintaining the structural integrity of the group of layers.

Also described are methods for generating an image. In these methods a multi-layer article is provided. The multi-layer comprises a first, interior, thermally activatable layer, wherein the first thermally activatable layer absorbs light of a first write wavelength and the first activatable layer has a first absorption threshold for activation. The multi-layer article also comprises a second, interior, thermally activatable layer, wherein the second thermally activatable layer absorbs light of the first write wavelength and the second activatable layer has a second absorption threshold for activation. The second absorption threshold is lower than the first absorption threshold. The multi-layer article also comprises a first blocking layer disposed between the first and second internal thermally activatable layers, the first blocking layer being adapted to at least partially block light of the first write wavelength. The multi-layer article also comprises a third, interior, thermally activatable layer, wherein the third thermally activatable layer absorbs light of a second write wavelength and the third activatable layer has a third absorption threshold for activation. The multi-layer article also comprises a fourth, interior, thermally activatable layer, wherein the fourth thermally activatable layer absorbs light of the second write wavelength and the fourth activatable layer has a fourth absorption threshold for activation. The fourth absorption threshold is lower than the third absorption threshold. The multi-layer article also comprises a second blocking layer disposed between the third and fourth internal thermally activatable layers, the second blocking layer being adapted to at least partially block light of the second write wavelength. At least one, and in some embodiment all, of the first, second, third and fourth activation layers comprise a light to heat convertor composition and a color changing compound. In other embodiments, some of the thermally activatable layers comprise a group of layers arranged to selectively reflect light by constructive or destructive interference to provide a first reflective characteristic, the group of layers also having a first absorption characteristic suitable to, upon exposure to light comprising the write wavelength, absorptively heat the first group of layers by an amount sufficient to change the first reflective characteristic to a second reflective characteristic while maintaining the structural integrity of the group of layers. The method also comprises exposing the multi-layer article to radiation of the first write wavelength and the proper configuration to pass through the first blocking layer to activate the second thermally activatable layer, and exposing the multi-layer article to radiation of the first write wavelength and the configuration to not pass through the first blocking layer to activate the first thermally activatable layer. The method also comprises exposing the multi-layer article to radiation of the second write wavelength and the proper configuration to pass through the second blocking layer to activate the fourth thermally activatable layer, and exposing the multi-layer article to radiation of the second write wavelength and the configuration to not pass through the second blocking layer to activate the third thermally activatable layer.

DETAILED DESCRIPTION

Figure 1:
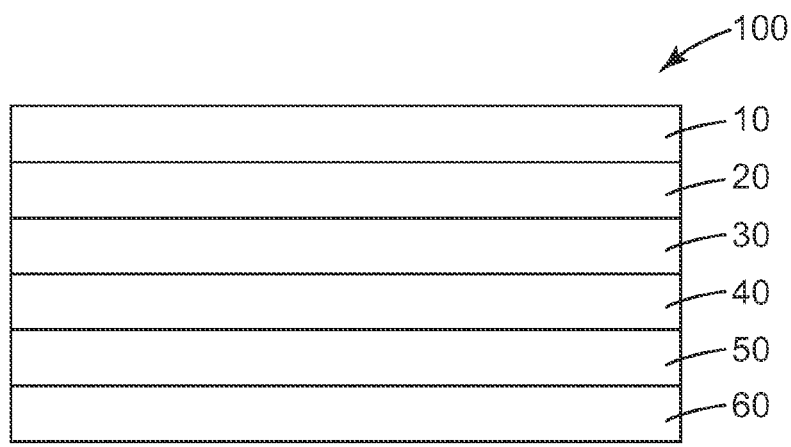
FIG. 1 shows a cross sectional view of a six layer article of this disclosure.

In a variety of applications it is desirable to have an article on which there is formed a multi-layer color image not on the surface layer or layers of an article or construction but within internal layers. The color image on such an article is more likely to be more resistant to scratches, stains as well as tampering without requiring lamination of protective layers over the image.

The term "layer" as used herein typically refers to a functional element, continuous in the film plane, comprising a region of the film defined in the thickness direction. The layer may comprise a monolithic material component, a single phase of miscible material components, a blend of immiscible material components, or a composite of sub-layers of individual material components, etc. The term "layer" may also be used generically, e.g. to describe an individual sub-layer of a greater functional "layer."

The term "multi-layer construction" as used herein refers to a construction comprising two or more layers. The layers may be of varying compositions and thicknesses. At least one of the layers of the multi-layer construction comprises a thermally activatable composition.

Disclosed herein are multi-layer articles capable of forming color images. In some embodiments, the multi-layer articles comprise at least six layers, where four of the layers are thermally activatable layers comprising first, second, third and fourth thermally activatable layers and the other layers comprise a first and a second blocking layer. The term "thermally activatable layer" as used herein refers to layers containing compounds and compositions which upon the application of heating or warming undergo a detectable change in color. The composition may, and typically does, contain two or more components. The detectable change may be the formation of a detectable change, such as a change from a colorless or a lightly colored state to a highly colored or a different color state. Conversely, the detectable change may be from a more colored to a less colored or colorless state. The term "activation" as used herein refers to the process whereby a thermally activatable layer absorbs light, the light is converted to heat by the light to heat converter composition, and upon absorbing sufficient light to overcome the "absorption threshold" the heating causes a detectable color change in the color changing compound. Such activation is achieved without damage to the article, where damage to the article refers to yellowing or darkening, surface roughening, delamination or any other detectable changes beyond the color change that occurs upon activation.

Generally, the first blocking layer is disposed between the first and second thermally activatable layers and the second blocking layer is disposed between the third and fourth thermally activatable layers, but a variety of layer configurations are possible. Typically, the thermally activatable layers are interior layers, meaning that they are not exposed to the outside environment. It is desirable for them to be interior layers so that the images formed on them are covered and protected from damage or tampering. The term "image" as used herein refers to any pattern of optical contrast produced on the inside of a substrate that has a similar appearance to a person or object. The image can have a two-dimensional or three-dimensional appearance. The image can be observed directly with the naked eye or by an instrument such as an optical device like a camera or microscope. Text and indicia, such as for example a name, birth date, signature, employee number, social security number and the like as well as decorative patterns and designs are, for purposes of this disclosure, also considered to be images. A "full color image" is one which contains the perceived colors cyan, magenta, yellow and black. A "durable image" is one which upon imaging retains its consistency for the desired lifetime of use of the article bearing the image. In some uses the desired lifetime may be relatively long such as one year, 5 years, or even 10 years or more. A "fixed image" is one to which a fixing step has been carried out. The term "fixing" as used herein refers to a post-imaging process step involving either exposure to radiation or heat to inactivate the color changing compound and prevent further imaging.

The first and second thermally activatable layers and the first blocking layer are selected to interact with light from a light source of a first write wavelength. The term "light source" as used herein refers to a source of radiation, for example, in the wavelength range of about 300-1500 nanometers. In some embodiments, the light source may be a laser. Lasers are well-known as sources of amplified, coherent electromagnetic radiation. In some embodiments the wavelength of the light source radiation is in the range 350-1100 nanometers. The term "write wavelength" as used herein refers to light at a wavelength $\lambda$ that can be used to selectively activate or "write" information to an activatable layer. Typically the light is substantially monochromatic at a wavelength $\lambda$, as is the case with most laser sources, or the light may be relatively narrow band with a center or peak occurring at a wavelength $\lambda$ as is the case with LED light sources. The third and fourth thermally activatable layers and the second blocking layer are selected to interact with light of a second write wavelength. The first write wavelength and the second write wavelength are not the same.

The first thermally activatable layer comprises a first light to heat convertor composition and a first color changing compound and the first activatable layer has a first absorption threshold for activation. The term "light to heat converter composition" as used herein refers to compounds or compositions that generate heat upon the absorption of light. The term "color changing compound" as used herein refers to compounds that upon heating produce a detectable color change. A color change may be detectable either with the naked eye or by using optical devices, such as, for example, a camera or microscope. Typically, the color change is from a colorless or lightly colored state to a more intensely colored state. In other cases, the color change is from a more intensely colored state to a state of lesser color intensity. Typically, the color change is in the visible portion of the spectrum, e.g. from a wavelength of 400 nm to 700 nm or more broadly from about 350 nm to 800 nm. (Values of wavelength refer to the wavelength in a vacuum corresponding to a given light frequency.) In other cases, the color change may be in the near infra-red, e.g. 700 nm to 1500 nm. In these near infra-red cases, the color change may be detectable only with an optical detection device. The detectable color change may be the result of the application of heat alone or may be a combination of heat and interaction with other reagents. Additionally, other components may be present in the first, thermally activatable layer. The light to heat convertor composition of the first, thermally activatable layer absorbs light of a first write wavelength. In some embodiments the first write wavelength is 532 nanometers, 808 nanometers, or 1064 nanometers. Typically, the absorption threshold for activation is higher for the first, thermally activatable layer than for the second thermally activatable layer described below. Likewise, the first thermally activatable layer is typically located within the multi-layer article such that it is closer to the source of light of the write wavelength at the time of activation.

In some embodiments the first light to heat convertor composition comprises a non-linear light to heat convertor composition. The term "non-linear light to heat converter composition" refers to a light to heat converter composition in which the light energy absorption coefficient is intensity or fluence dependent, where intensity is energy per unit area per unit time and fluence is energy density or energy per unit area. The light absorption through a medium generally follows Beer's Law as shown in equations 1 and 2 below:

$$I(z) = I_0 e^{-\alpha z} \quad (1)$$

or $$\frac{dI}{dz} = -\alpha I \quad (2)$$

where I(z) is the intensity of the light at the medium penetration depth z, $I_0$ is the light intensity before it is attenuated by the medium, a is the absorption coefficient and I is the light intensity. For a linear light absorber, the absorption coefficient is a constant, independent of the light intensity or fluence. Nonlinear absorption, on the other hand, means that the absorption coefficient depends on the light intensity or fluence. This can lead to both increased transmittance with increasing light intensity or decreased transmittance with increasing light intensity.

A wide variety of non-linear light to heat converter compositions are useful. The nonlinear light absorbers may be two-photon absorption (2Ph) species or reverse saturable absorption (RSA) species.

The two-photon (2Ph) process is a nonlinear light absorption process in which the photon energy is approximately equal to half the energy required for linear excitation of the material. Excitation of the absorbing material therefore requires the simultaneous absorption of two of the lower energy photons. The absorption coefficient for this process is therefore light intensity dependent as shown in equation 3 below:

$$\alpha = \alpha_0 + \beta I \quad (3)$$

where $\alpha_0$ is the residual linear absorption coefficient and $\beta$ is the two-photon absorption coefficient.

Examples of useful two-photon absorbers include those exhibiting large multiphoton absorption cross-sections, such as Rhodamine B (that is, N-[9-(2-carboxyphenyl)-6-(diethylamino)-3H-xanthen-3-ylidene]-N-ethylethanaminium chloride and the hexafluoroantimonate salt of Rhodamine B) and the four classes of photosensitizers described, for example, in PCT Publication Nos. WO 98/21521 and WO 99/53242. The four classes can be described as follows: (a) molecules in which two donors are connected to a conjugated π-electron bridge; (b) molecules in which two donors are connected to a conjugated π-electron bridge which is substituted with one or more electron accepting groups; (c) molecules in which two acceptors are connected to a conjugated π-electron bridge; and (d) molecules in which two acceptors are connected to a conjugated π-electron bridge which is substituted with one or more electron donating groups (where "bridge" means a molecular fragment that connects two or more chemical groups, "donor" means an atom or group of atoms with a low ionization potential that can be bonded to a conjugated π-electron bridge, and "acceptor" means an atom or group of atoms with a high electron affinity that can be bonded to a conjugated π-electron bridge).

The four above-described classes of two-photon absorbers can be prepared by reacting aldehydes with ylides under standard Wittig conditions or by using the McMurray reaction, as detailed in PCT Publication No. WO 98/21521.

Other useful two-photon absorbers are described in U.S. Pat. Nos. 6,100,405, 5,859,251, and 5,770,737. These compounds are described as having large multiphoton absorption cross-sections.

The RSA process is also sometimes referred to as excited state absorption, and is characterized by the absorption cross section for the excited state involved in the absorption process being much larger than the cross section for excitation from the ground state to the excited state. The total light absorption involves both ground state absorption (the linear term) and excited state absorption. The equation describing the light intensity (I) as a function of depth of the material (z) is therefore given by equation 4:

$$\frac{dI}{dz} = -(\alpha_0 + \sigma N)I \quad (4)$$

where $\sigma$ is the absorption cross-section for transitions from the excited state. The population density of the excited state N, is produced by ground state absorption (linear absorption) with absorption coefficient $\alpha_0$ and is given by equation 5 below:

$$dN/dt = \alpha_0 I/\hbar\omega \quad (5)$$

where $\hbar\omega$ is the incident photon energy.

Integration of equation (5) with respect to time, substitution into equation (4), and integration with respect to time again results in equation 6 below:

$$\frac{dF}{dz} = -\left[\alpha_0 + \frac{\alpha_0 \sigma}{2\hbar\omega}F\right]F \quad (6)$$

These equations show that the dependence of the energy density, or fluence (F), of the light in the material depends on the square of the fluence. This equation is analogous to equation 3 above, with the term β replaced by $\alpha_0\sigma/2\hbar\omega$, and indicates that excited state absorption and two-photon absorption generally give nearly identical results for absorption of light by the material as a function of light intensity or fluence.

Examples of reverse saturable absorption materials that function as non-linear light to heat converter compositions include, for example, metallophthalocyanines, naphthalocyanines, cyanines, fullerenes, metal nanoparticles, metal oxide nanoparticles, metal cluster compounds, porphyrins, indanthrone derivatives and oligomers or combinations thereof. Examples of metallophthalocyanines include, for example, copper phthalocyanine (CuPC), and phthalocyanines containing metal or metalloids from group IIIA (Al, Ga, In) and IVA (Si, Ge, Sn, Pb). Examples of naphthalocyanines include, for example, the phthalocyanine derivatives of silicon (SiNC), tin (SnNC), and lead (PbNC). Examples of cyanines include, for example, 1,3,3,1',3',3'-hexamethylindotricarbocyanine iodide (HITCI). Examples of fullerenes include, for example, C60 and C70 fullerenes. Examples of metal nanoparticles include, for example, gold, silver, platinum, aluminum, and zinc nanoparticles, Examples of metal oxide nanoparticles include, for example, titanium dioxide, antimony tin oxide, and zirconium dioxide nanoparticles. Examples of metal clusters include, for example, iron tricobalt metal clusters such as $HFeCo_3(CO)_{12}$ and $NEt_4FeCO_3(CO)_{12}$. Examples of porphyrins include, for example, tetraphenylporphyrin (H2TPP), zinc tetraphenylporphyrin (ZnTPP), and cobalt tetraphenylporphyrin (CoTPP). Examples of indanthrone derivatives include, for example, unsubstituted indanthrone, oxidized indanthrone, chloroindanthrone, and an indanthrone oligomer.

In some embodiments, the non-linear light to heat converter composition comprises copper phthalocyanine, tin phthalocyanine, or a combination thereof.

The non-linear light to heat converter composition generally may be present in fairly small quantities. Typically the non-linear light absorber is present in the amount of about 0.05-5 weight % or even 0.1-3 weight %.

In some embodiments, the first light to heat convertor composition comprises a linear light to heat convertor composition. The term "linear light to heat convertor" as used herein refers to a material element that absorbs light proportionally to the applied intensity or incident fluence on that element; thus, the amount of energy converted from light to heat is likewise proportional. For example, the absorption coefficient is constant over the range of applied light intensity or incident fluence of interest. Examples of linear light to heat convertor compositions include absorbing dyes, pigments, or other agents that can be incorporated into the first, thermally activatable layer to promote absorptive heating as mentioned above. Virtually any absorbing dye, pigment of other agent may be used as long as the absorbing agents absorb light of the first write wavelength. Examples of useful linear light to heat converting dyes include, but are not limited to, AMAPLAST 1000 and AMAPLAST 1050 both commercially available from Color Chem International (Atlanta, Ga.), EPOLIGHT 4121 commercially available from Epolin Inc. (Piscataway, N.J.), and mixed metal oxides of antimony and tin commercially available from Keeling and Walker.

The first thermally activatable layer also includes a color changing compound. The color changing compounds typically are cyan-forming (i.e. forms a cyan color upon activation), magenta-forming (i.e. forms a magenta color upon activation), yellow-forming (i.e. forms a yellow color upon activation), or black-forming (i.e. forms a black color upon activation). Typically the color changing compound is a leuco dye. The term "leuco dye" as used herein refers to compounds which change from essentially colorless to colored when heated, with or without the presence of other reagents.

A number of classes of leuco dye materials are useful as the color changing compounds of this disclosure. Among the useful materials are, for example: azines such as oxazines, diazines and thiazines; triarylmethanes such as fluoresceins, rhodamines and rhodols; ketazines; barbituric acid leuco dyes and thiobarbituric acid leuco dyes.

Examples of azine leuco dyes that are suitable for use as color changing compounds include those which can be described by Formula I below:

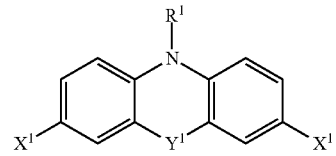

Formula I where $R^1$ is $—C(O)R^2$, where C(O) designates a carbonyl group, each $X^1$ can independently be $OR^2$, $NR^2_2$ or $SR^2$ and $Y^1$ can be O, $NR^2$ or S, where each $R^2$ is independently a hydrogen, an alkyl, an aryl, or a heteroalkyl. In Formula I, when $Y^1$ is an oxygen the compound is an oxazine, when $Y^1$ is equal to $NR^2$, the compound is a diazine and when $Y^1$ is equal to sulfur the compound is a thiazine. In some embodiments the color changing compound of Formula I has $X^1$ equal to $NR^2_2$, where $R^2$ is an alkyl, $Y^1$ is equal to oxygen, and $R^1$ is equal to $—C(O)Ar$, where Ar is an aryl group. In some embodiments the color changing compound of Formula I has $X^1$ equal to $NR^2_2$, where $R^2$ is an ethyl group, $Y^1$ is equal to oxygen, and $R^1$ is equal to $—C(O)Ph$, where Ph is a phenyl group.

Examples of triarylmethane leuco dyes include those which can be described by Formula II below:

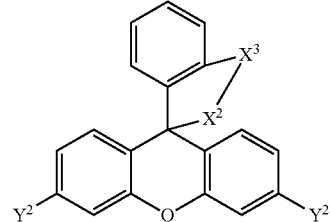

Formula II where $X^2$ can be O, $NR^2$ or S, where $R^2$ is a hydrogen, an alkyl, an aryl, or a heteroalkyl, $X^3$ can be carbonyl (C=O), thiocarbonyl (C=S), or $SO_2$, and each $Y^2$ can independently be $OR^2$, $NR^2_2$ or $SR^2$ where $R^2$ is as defined above. In Formula II, when each $Y^2$ is $OR^2$, the compound is a fluorescein, when each $Y^2$ is $NR^2_2$, the compound is a rhodamine and when one $Y^2$ is $NR^2_2$ and the other $Y^2$ is $OR^2$ the compound is a rhodol. In some embodiments, $X^3$ is a carbonyl, $X^2$ is O or S, and $Y^2$ is $OR^2$, $NR^2{}_2$ or $SR^2$ where $R^2$ is as defined above. In some embodiments, $X^3$ is a carbonyl, $X^2$ is O, and $Y^2$ is $OR^2$, $NR^2{}_2$ or $SR^2$ where $R^2$ is as defined above.

Examples of ketazines include those which can be described by Formula III below:

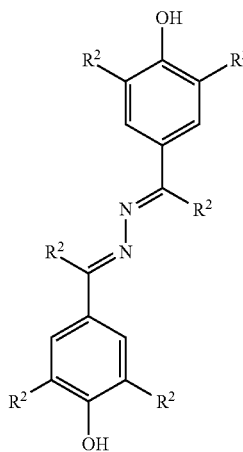

Formula III where each $R^2$ is independently a hydrogen, an alkyl, an aryl, or a heteroalkyl. In some embodiments, each $R^2$ is independently a hydrogen or an alkyl group.

Examples of barbituric acid leuco dyes include those which can be described by Formula IV below:

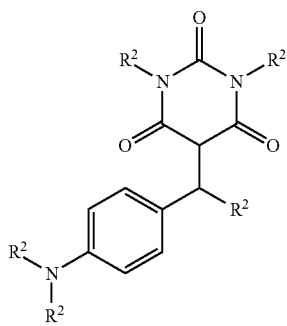

Formula IV where each $R^2$ is independently a hydrogen, an alkyl, an aryl, or a heteroalkyl. In some embodiments, each $R^2$ is independently a hydrogen or an alkyl group.

Examples of thiobarbituric acid leuco dyes include those which can be described by Formula V below:

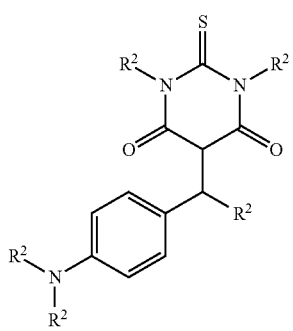

Formula V where each $R^2$ is independently a hydrogen, an alkyl, an aryl, or a heteroalkyl. In some embodiments, each $R^2$ is independently a hydrogen or an alkyl group.

In addition to the above classes of leuco dyes, materials described by Formula VI and Formula VII below may also be useful leuco dyes:

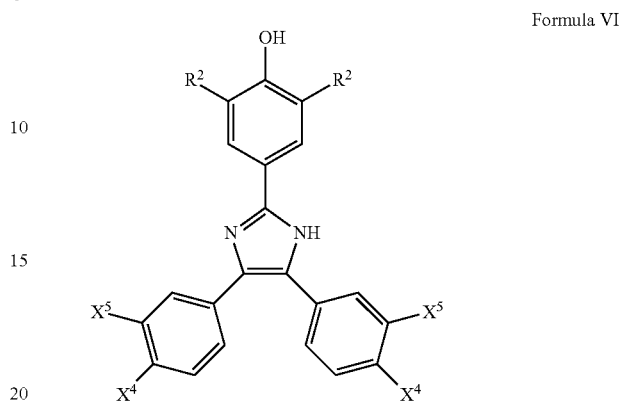

Formula VI where each $R^2$ is independently a hydrogen, an alkyl, an aryl, or a heteroalkyl, each $X^4$ is independently hydrogen, $OR^2$, $NR^2{}_2$ or $SR^2$, where $R^2$ is as defined above, each $X^5$ is independently hydrogen, $NO_2$ or CN. In some embodiments, each $R^2$ is independently a hydrogen or an alkyl group, each $X^4$ is $OR^3$, where $R^3$ is hydrogen or an alkyl group, and $X^5$ is $NO_2$. In some embodiments, the $X^4$ of one ring is $OR^3$ where $R^3$ is an ethyl group, and the $X^4$ of the other ring is hydrogen, the $X^5$ of one ring is hydrogen and the $X^5$ of the other ring is $NO_2$, and each $R^2$ is tert-butyl.

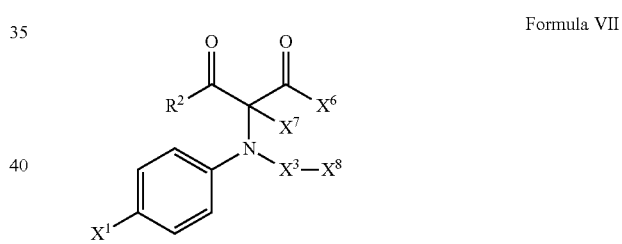

Formula VII where $X^1$ is $OR^2$, $NR^2{}_2$ or $SR^2$, $X^3$ can be carbonyl (C=O), thiocarbonyl (C=S), or $SO_2$, and each $R^2$ is independently a hydrogen, an alkyl, an aryl, or a heteroalkyl as previously defined above, and $X^6$ is $OR^2$, $NR^2{}_2$ or $SR^2$, $X^7$ is hydrogen, $OR^2$, or $SR^2$, and $X^8$ is $R^2$, $OR^2$, $NR^2{}_2$ or $SR^2$. In some embodiments $X^3$ is carbonyl (C=O), or $SO_2$, $X^6$ is $OR^2$, $NR^2{}_2$ or $SR^2$, $X^7$ is hydrogen, $OR^2$, or $SR^2$, and $X^8$ is $R^2$, $OR^2$, $NR^2{}_2$ or $SR^2$.

The amount of color changing compound included in the thermally activatable composition varies depending upon the specific color changing compound chosen as well as other factors, such as desired color intensity, cost, etc. Typically the color changing compound is present in the amount of about 0.1-50 weight % or even 0.5-30 weight %.

The first, thermally activatable layer may comprise a variety of additives in addition to the light to heat converter composition and the color changing compound. The thermally activatable layers typically include a polymeric binder. Any suitable polymeric material may be used as the polymeric binder as long is doesn't interfere with the image formation, observation or stability. In some embodiments, the first, thermally activatable layer may comprise from 50 wt % to 99.8 wt % polymeric binder.

A wide variety of non-reactive polymeric binders may be used. The polymeric binders are useful, for example, to control viscosity and to provide film-forming properties. Such polymeric binders typically are chosen to be compatible with the thermally activatable composition materials. For example, polymeric binders that are soluble in the same solvent or solvents that are used for the thermally activatable composition and that are free of functional groups that can adversely affect the color change of the thermally activatable composition can be utilized. Polymeric binders may be of any suitable molecular weight to achieve the desired solution rheology and film-forming properties. In some embodiments, the number average molecular weight, Mn, may be between 5,000 and 1,000,000 Daltons, or 10,000 to 500,000 Daltons or even 15,000 to 250,000 Daltons. Suitable polymeric binders include, for example, polystyrenes, poly(methyl methacrylates), poly(styrene)-co-(acrylonitriles), cellulose acetate butyrates, poly(bisphenol A epichlorohydrin)glycidyl end-capped copolymers and the like.

In addition to the light to heat converter composition, the color changing compound and the optional polymeric binder, the thermally activatable layer may also contain other additives. Among the useful additives which may be incorporated into the thermally activatable layer, are species which aid the image formation. For example, thermal acid generators may be included. The thermal acid generators release an acid upon thermal excitation. The acid can initiate or catalyze the thermal transformation of the color changing compound permitting more rapid and/or more complete image formation. Suitable thermal acid generators include both materials that generate Bronsted acids (protons) and Lewis acids (electron pair acceptors).

A variety of materials which liberate acid upon heating may be used as a thermal acid generator. For example, Sabongi, G. J., Chemical Triggering-Reactions of Potential Utility in Industrial Processes, Plenum Press, New York, N.Y. (1987), pages 68-72 describes thermally triggered release of carboxylic acids from esters and oxime derivatives, especially benzaldoximes and oxalic acid esters.

Examples of useful thermal acid generators include those disclosed in U.S. Pat. No. 4,670,373 (Kitaguchi et al.), which describes the thermal decomposition of N-carboxy aldoximes to give benzoic acid derivatives as shown below.

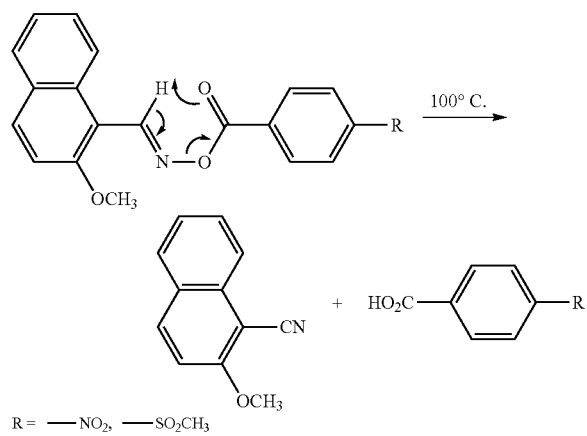

Another class of useful thermal acid generators includes those disclosed in U.S. Pat. No. 4,011,352 (Janssens et al.) which describes the thermal decomposition of the half esters of anhydrides to give stronger dicarboxylic acids as is shown below.

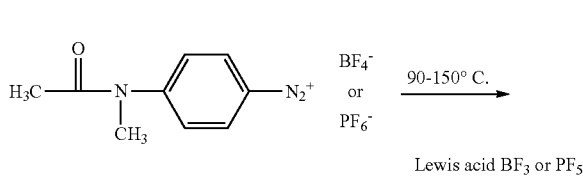

Stronger acid

Examples of Lewis acid thermal acid generators include those disclosed in U.S. Pat. No. 2,995,466 (Sorensen) which describes the thermal generation of Lewis acids from diazonium salt acid-progenitors containing counterions such as tetrafluoroborate, hexafluorophosphate, and the like. An example of the acid generation mechanism is shown below.

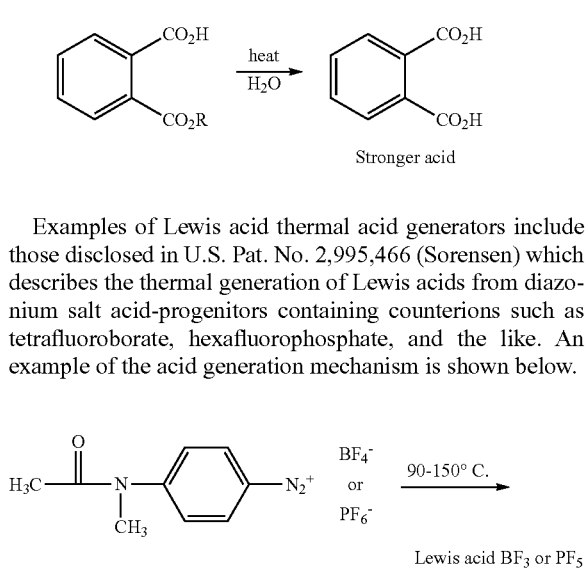

Lewis acid BF$_3$ or PF$_5$

Another example of suitable thermal acid generators includes those disclosed in U.S. Pat. No. 5,554,664 (Lamanna, et al.) which describes the thermal generation of acids from diazonium salts with non-coordinating anionic counterions. Examples of anionic non-coordinating anions include for example highly fluorinated alkylsulfonyl methide, a fluorinated arylsulfonyl methide, a highly fluorinated alkyl sulfonyl imide, a fluorinated arylsulfonyl imide, a mixed aryl- and alkylsulfonyl imides and methides, or combinations thereof.

Another type of suitable thermal acid generator is that described in U.S. Pat. No. 5,278,031 (Boggs et al.), which describes certain squaric acid derivatives as effective heat-sensitive acid generating materials for use in thermal imaging. An example of this thermal transformation is shown below. Squaric acid has reported pKa values of 0.59 and 3.48 (Schwartz and Howard, J. Phys. Chem. 74 4374 1970).

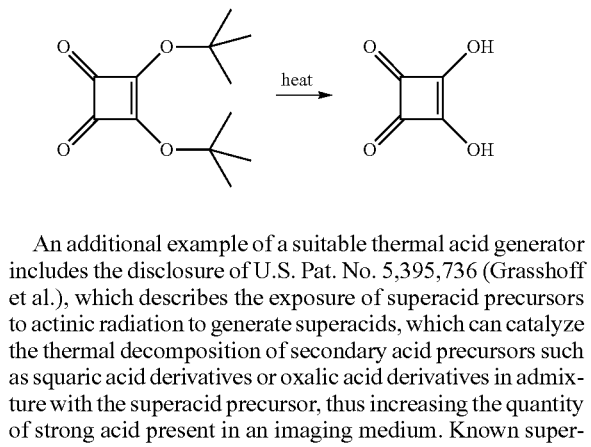

An additional example of a suitable thermal acid generator includes the disclosure of U.S. Pat. No. 5,395,736 (Grasshoff et al.), which describes the exposure of superacid precursors to actinic radiation to generate superacids, which can catalyze the thermal decomposition of secondary acid precursors such as squaric acid derivatives or oxalic acid derivatives in admixture with the superacid precursor, thus increasing the quantity of strong acid present in an imaging medium. Known superacid precursors include diazonium, phosphonium, sulfonium and iodonium compounds. Similarly, U.S. Pat. No. 5,914,213 (Grasshoff et al.) describes a similar process using tosylate and phosphate derivatives as secondary acid precursors.

Another suitable class of thermal acid generators is that disclosed in U.S. Pat. No. 6,627,384 (Kim et al.), which describes cyclic alcohols with adjacent sulfonate leaving groups. The sulfonate leaving groups form acids upon the application of heat as is demonstrated in the mechanism shown below.

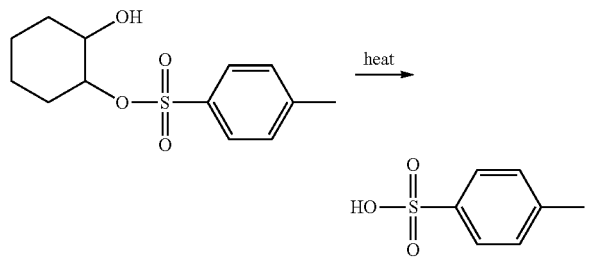

Typically, if used, the thermal acid generator is present in the thermally activatable layer in amounts of about 0.1-10 weight %.

Additionally, the thermally activatable layer may contain fixing additives. Fixing additives are added to fix the image once it is formed. By fixing the image, the image is prevented from undergoing further imaging to alter, obscure, obliterate or otherwise change the image. Examples of fixing additives include, for example, 1-phenyl-3-pyrazolidone, hydroquinones, naphthoquinones, a hydroquinone ethers, naphthoquinone ethers, hydronaphthoquinone ethers, or mixtures thereof.

Typically, if used, the fixing compound is present in the thermally activatable layer in amounts in the range of about 0.05-10 weight %.

Other useful additives include materials such as processing aids, dispersants and the like as long as such additives do not interfere with the activatable properties of the layer. For example, dispersants may be useful to help to control the particle size of undissolved dyes, pigments, or other agents in the thermally activatable layer.

The second, thermally activatable layer comprises a second light to heat convertor composition and a second color changing compound and the second activatable layer has a second absorption threshold for activation. Additionally, other components may be present in the second, thermally activatable layer. The light to heat convertor composition of the second, thermally activatable layer absorbs light of the first write wavelength, as described above. Typically, the absorption threshold for activation is lower for the second, thermally activatable layer than for the first, thermally activatable layer described above.

The second light to heat convertor composition and a second color changing compound and additional optional components included in the second, thermally activatable layer are selected from the same components described above.

In some embodiments, the first light to heat convertor composition and the second light to heat convertor composition are the same composition and the concentration of the second light to heat convertor composition is higher than the concentration of the first light to heat convertor composition.

In other embodiments, the first light to heat convertor composition and the second light to heat convertor composition are different and the second light to heat convertor composition is more sensitive to light of the first write wavelength. Therefore, less light is required to activate the second thermally activated layer than the first thermally activated layer.

Typically, the first color changing compound and the second color changing compound form different colors upon thermal activation. This permits images with multiple colors to be formed using light of a single write wavelength.

A first blocking layer disposed between the first and second thermally activatable layers. The first blocking layer is adapted to at least partially block light of the first write wavelength. It is typically not necessary for the first blocking layer to block all light of the first write wavelength as long as the blocking layer is capable of blocking enough light to prevent undesirable activation of the second thermally activatable layer. In some embodiments the first blocking layer is substantially reflective at the first write wavelength. In other embodiments, the first blocking layer may have blocking characteristics that are strong functions of polarization. In embodiments where the first blocking layer is substantially reflective at the first write wavelength, the first blocking layer may incorporate a multi-layer stack whose reflectivity is a function of incidence angle such that the blocking layer substantially reflects a first beam of light at the first write wavelength and substantially transmits a second beam of light at the first write wavelength, the first and second beams having different angles of incidence. In embodiments where the first blocking layer has blocking characteristics that are strong functions of polarization, the blocking layer may be or comprise a reflective polarizer or an absorptive polarizer, for example. In such a case the blocking layer may substantially block (by absorption or reflection) a first beam of light at the first write wavelength and substantially transmit a second light beam at the first write wavelength, where the first and second light beams may differ only in their polarization states. In embodiments where the first blocking layer is an absorptive polarizer, e.g. with a dichroic light to heat convertor composition to selectively absorb the write wavelength of a given polarization, the blocking layer typically are adequate heat sinks to prevent undesired thermal transfer to the second thermally activatable layer during the selective writing of the first thermally activatable layer. Suitable reflective blocking layers are described, for example, in co-pending PCT Application "Multilayer Optical Films Suitable for Bi-Level Patterning" (Merrill et al.), PCT/US09/69173, filed on Dec. 22, 2009.

In embodiments where the first blocking layer incorporates a multi-layer stack whose reflectivity is a function of incidence angle, adjacent microlayers of the multi-layer optical film have different refractive indices so that some light is reflected at interfaces between adjacent layers. We refer to the refractive indices of one of the microlayers for light polarized along principal x-, y-, and z-axes as n1x, n1y, and n1z, respectively. We refer to the refractive indices of the adjacent microlayer along the same axes as n2x, n2y, n2z, respectively. We refer to the differences in refractive index between these layers as $\Delta$nx (=n1x−n2x) along the x-direction, $\Delta$ny (=n1y−n2y) along the y-direction, and $\Delta$nz (=n1z−n2z) along the z-direction. The nature of these refractive index differences, in combination with the number of microlayers in the film (or in a given stack of the film) and their thickness distribution, controls the reflective and transmissive characteristics of the film (or of the given stack of the film) in a given zone. A group of such mutually adjacent and coherent microlayers, acting collectively to form a reflection band, may be referred to as a "packet". When multiple packets are present within a multi-layer stack, thicker layers may also reside between the packets. For example, if adjacent microlayers have a large refractive index mismatch along one in-plane direction ($\Delta$nx large) and a small refractive index mismatch along the orthogonal in-plane direction ($\Delta$ny≈0), the film or packet may behave as a reflective polarizer for normally incident light. In this regard, a reflective polarizer may be considered for purposes of this application to be an optical body that strongly reflects normally incident light that is polarized along one in-plane axis (referred to as the "block axis") if the wavelength is within the reflection band of the film, and strongly transmits such light that is polarized along an orthogonal in-plane axis (referred to as the "pass axis"). "Strongly reflects" and "strongly transmits" may have slightly different meanings depending on the intended application or field of use, but in many cases a reflective polarizer will have at least 70, 80, or 90% reflectivity for the block axis, and at least 70, 80, or 90% transmission for the pass axis.

In another example, adjacent microlayers may have a large refractive index mismatch along both in-plane axes ($\Delta nx$ large and $\Delta ny$ large), in which case the film or packet may behave as an on-axis mirror. In this regard, a mirror or mirror-like film may be considered for purposes of this application to be an optical body that strongly reflects normally incident light of any polarization if the wavelength is within the reflection band of the film. Again, "strongly reflecting" may have slightly different meanings depending on the intended application or field of use, but in many cases a mirror will have at least 70, 80, or 90% reflectivity for normally incident light of any polarization at the wavelength of interest.

In variations of the foregoing embodiments, the adjacent microlayers may exhibit a refractive index match or mismatch along the z-axis ($\Delta nz \approx 0$ or $\Delta nz$ large), and the mismatch may be of the same or opposite polarity or sign as the in-plane refractive index mismatch(es). Such tailoring of $\Delta nz$ plays a key role in whether the reflectivity of the p-polarized component of obliquely incident light increases, decreases, or remains the same with increasing incidence angle. In yet another example, adjacent microlayers may have a substantial refractive index match along both in-plane axes ($\Delta nx \approx \Delta ny \approx 0$) but a refractive index mismatch along the z-axis ($\Delta nz$ large), in which case the film or packet may behave as a so-called "p-polarizer", strongly transmitting normally incident light of any polarization, but increasingly reflecting p-polarized light of increasing incidence angle if the wavelength is within the reflection band of the packet.

In view of the large number of permutations of possible refractive index differences along the different axes, the total number of layers and their thickness distribution(s), and the number and type of microlayer packets included in the multi-layer optical film, the variety of possible multi-layer optical films and packets thereof is vast. We refer to multi-layer optical films disclosed in any of the patent documents cited herein (whether or not patented, and whether published by the U.S. Patent Office or by any another country or patent authority), as well as the following documents, all of which are incorporated herein by reference, insofar as the teachings therein do not conflict with the present disclosure: U.S. Pat. No. 5,486,949 (Schrenk et al.) "Birefringent Interference Polarizer"; U.S. Pat. No. 5,882,774 (Jonza et al.) "Optical Film"; U.S. Pat. No. 6,045,894 (Jonza et al.) "Clear to Colored Security Film"; U.S. Pat. No. 6,531,230 (Weber et al.) "Color Shifting Film"; U.S. Pat. No. 6,939,499 (Merrill et al.) "Processes and Apparatus for Making Transversely Drawn Films with Substantially Uniaxial Character"; U.S. Pat. No. 7,256,936 (Hebrink et al.) "Optical Polarizing Films with Designed Color Shifts"; U.S. Pat. No. 7,316,558 (Merrill et al.) "Devices for Stretching Polymer Films"; PCT Publication WO 2008/144136 A1 (Nevitt et al.) "Lamp-Hiding Assembly for a Direct Lit Backlight"; PCT Publication WO 2008/144656 A2 (Weber et al.) "Backlight and Display System Using Same" and PCT Application "Multilayer Optical Films Suitable for Bi-Level Patterning" (Merrill et al.), PCT/US09/69173, filed on Dec. 22, 2009.

In other embodiments, the first blocking layer may have blocking characteristics that are independent, weakly dependent, or strongly dependent on the polarization state of the incident light. That is to say, the blocking layer may be rotationally symmetric, or it may instead have varying degrees of rotational asymmetry, for rotations about the normal or z-axis. At one extreme, the blocking layer may be substantially rotationally symmetric about the z-axis, such that linearly polarized normally incident light at the first write wavelength is blocked the same amount or to the same degree regardless of which in-plane axis of the blocking layer (e.g., the x-axis or the y-axis) the polarized light is aligned with. At another extreme, the blocking layer may be strongly rotationally asymmetric, such that linearly polarized normally incident light at the first write wavelength is strongly blocked if aligned with one in-plane axis (e.g. the x-axis), and strongly transmitted if aligned with an orthogonal in-plane axis (e.g. the y-axis). Thus, the blocking layer may be or comprise a reflective polarizer or an absorptive polarizer, for example. In such a case the blocking layer may substantially block (by absorption or reflection) a first beam of light at the first write wavelength and substantially transmit a second light beam at the first write wavelength, where the first and second light beams may differ only in their polarization states and not in their angles of incidence. The situation in which the blocking layer blocks light of a certain polarization can be described as a "blocking state" for that light and the situation where the blocking layer transmits light of a certain polarization can be described as a "pass state" for that light. Such rotationally asymmetric blocking characteristics may also be limited to a particular reflection band of the electromagnetic spectrum, beyond which the blocking layer substantially transmits and does not block incident light of any polarization. Such reflection band may also shift with incident angle, as discussed elsewhere herein.

Regardless of the details of the blocking layer, the first and second thermally activatable layers can be independently patterned or "written" using a single wavelength or wavelength band, referred to as a first write wavelength. The independent patterning can be facilitated by the blocking layer which at least partially blocks the first write wavelength. Light of the first write wavelength may be delivered by a laser, for example. In some embodiments, the blocking layer is reflective. In these embodiments, when the multi-layer article is subjected to laser irradiation of the first write wavelength and at a certain angle of incidence, only the first thermally activatable layer receives sufficient optical power to overcome the activation threshold and produce a consequent color change. Similarly, when the multi-layer article is subjected to laser irradiation with the same first write wavelength and a different angle of incidence, only the second thermally activatable layer receives sufficient optical power to overcome the activation threshold and produce a consequent color change. In other embodiments, where the first blocking layer is dependent on the polarization state of the incident light, when the multi-layer article is subjected to laser irradiation of the first write wavelength with a polarization in the blocking state, only the first thermally activatable layer receives sufficient optical power to overcome the activation threshold and produce a consequent color change. Similarly, when the multi-layer article is subjected to laser irradiation with a polarization in the pass state, only the second thermally activatable layer receives sufficient optical power to overcome the activation threshold and produce a consequent color change. Typically, the first thermally activatable layer is positioned to be closer to the radiant energy source that produces light of the write wavelength than the second thermally activatable layer. Because the first thermally activatable layer has a higher threshold for activation, the second thermally activated layer can be activated under writing conditions above its own threshold but below the threshold of activation of the first thermally activatable layer. Under these conditions, the second thermally activatable layer can be selectively activated without activating the first thermally activatable layer.

The multi-layer article also comprises third and fourth thermally activatable layers and a second blocking layer. The only difference between these thermally activatable layers and blocking layers and those previously described is that the third and fourth thermally activatable layers absorb light of a second write wavelength and the second blocking layer at least partially blocks light of the second write wavelength. The second write wavelength is different from the first write wavelength. In some embodiments, the first write wavelength is about 808 nanometers and the second write wavelength is about 1064 nanometers.

Typically, each thermally activated layer generates a different color upon activation. The use of four thermally activated layers and two blocking layers permits the generation of four different colors, or a full color image. Generally, the colors formed upon activation are cyan, magenta, yellow and black. Typically. two different light sources, such as two different lasers are used to give the full color images.

In some embodiments, the layers are arranged in the sequence: first thermally activatable layer/first blocking layer/second thermally activatable layer/third thermally activatable layer/second blocking layer/fourth thermally activatable layer, but other configurations are possible.

Additionally, there may be thermally non-activatable layers between, on top of, or below the thermally activatable layers. The presence of thermally non-activatable layers between thermally activatable layers may help prevent the thermally activatable layers from interacting during preparation or during activation. One particularly useful thermally non-activatable layer is a complete blocking layer. In a completely blocking layer, no polarization or angular condition can process any of the thermally activatable layers without obvious damage (e.g. tamper evidence) to the article. Such completely blocking layers may include fully opaque, absorptive, reflective or scattering layers. Use of a complete blocking layer as a support layer in a multi-layer construction permits the article to be activated from only one side, since the side containing the complete blocking layer is prevented from being able to be activated.

The thermally non-activatable layers, if used, may be prepared from any useful materials. Typically the layers comprise polymeric materials. In some embodiments the polymeric materials are thermoplastics, but elastomeric materials may also be used in certain embodiments. Generally, thermally non-activatable layers positioned above the thermally activatable layers in a multi-layer construction are transparent to visible light thus permitting the image formed in the thermally activatable layers to be visible. Thermally non-activatable layers that are below the image or not in the light path of the image need not be transparent to visible light.

Thermally non-activatable layers may be used to provide rigidity to the multi-layer construction and/or protection for the image formed by the thermally activatable layers. For example, the non-activatable layers may be used to provide chemical resistance, scratch resistance, shock resistance and tamper resistance for the image. The thermally non-activatable layers may exist as a single layer or multiple layers. If multiple layers are used, the multiple layers may comprise different compositions.

Examples of useful materials for thermally non-activatable layers include, for example, polyesters, polyurethanes, polyolefins, and polycarbonates.

The thickness of thermally non-activatable layers may be any suitable thickness, to provide, in combination with the thermally activatable layers, the desired thickness and mechanical and optical properties to the multi-layer construction. In some embodiments, the thermally non-activatable layers may vary from 5 micrometers to 50 micrometers in thickness. In some embodiments, for example it may be desirable to have relatively thick (that is to say greater than 50 micrometers) thermally non-activatable layers to provide rigidity and resiliency to the multi-layer construction. In other embodiments it may be desirable to have relatively thin thermally non-activatable layers. In still other embodiments it may be desirable to have some thermally non-activatable layers be relatively thick (such as, for example, the exterior layers of the multi-layer construction) and have other layers be relatively thin (such as, for example, the layers between the thermally activatable layers).

Also disclosed are multi-layer articles comprising at least six layers, where four of the layers are thermally activatable layers comprise thermally activatable layers and the other layers comprise two blocking layers. At least one of the thermally activatable layers comprises a first light to heat convertor composition and a first color changing compound and the first activatable layer has a first absorption threshold for activation as described in detail above. The blocking layers are also as described in detail above. At least one of the other thermally activatable layers, however, comprises a multi-layer optical film. Multi-layer optical films contain a multiplicity of distinct layers of different refractive index and of suitable thicknesses to selectively reflect and transmit light as a result of constructive and destructive interference of light reflected at the interfaces between the layers. Such films may be formed by coextruding different organic polymer materials in an alternating layer arrangement through a die, cooling the extrudate to form a cast web, and stretching the cast web in order to thin the web to a suitable final thickness. This results in a multi-layer optical film that comprises a plurality of interior layers arranged into optical repeat units to selectively reflect light over certain wavelength regions by constructive or destructive interference. By incorporation of a suitable light to heat converting compound into one or both of the optical repeat units of the multi-layer optical film during the extrusion step, the layers of the film can be selectively heated by absorption at the writing wavelength in an amount sufficient to reduce or eliminate the birefringence of the layers. In the x- and y- (in-plane) directions, the heating can be patternwise applied to selected in-plane areas or zones of the film by shaping the light beam as appropriate so that only the selected in-plane areas or zones are exposed to the light. The patternwise heating can be performed by the judicious delivery of an appropriate amount of energy to a selected in-plane zone so as to selectively heat some of the interior layers therein to a temperature high enough to produce a relaxation in the material that reduces or eliminates a preexisting optical birefringence, but low enough to maintain the physical integrity of the layer structure within the film. In the z- (thickness) direction, the heating can be applied to different selected interior portions of the film by suitable design of the multi-layer optical film, in combination with suitable delivery characteristics of the directed light beam. The reduction in birefringence may be partial or it may be complete, in which case some of the interior layers that are birefringent in a first (untreated) zone are rendered optically isotropic in a second (treated) zone. This reduction in birefringence of selected layers changes the optical properties of the multi-layer film and can be used to produce an image. Examples of such thermally activatable layers are described, for example, in co-pending PCT Applications: "Multilayer Optical Films Suitable for Bi-Level Patterning", PCT/US09/69173, filed on Dec. 22, 2009; "Internally Patterned Multilayer Optical Films Using Spatially Selective Birefringence Reduction" PCT/US09/69153 filed on Dec. 22, 2009; "Multilayer Optical Films Having Side-by-Side Mirror/Polarizer Zones", PCT/US09/69120, filed Dec. 22, 2009; "Internally Patterned Multilayer Optical Films With Multiple Birefringent Layers", PCT/US09/69160, filed Dec. 22, 2009; and "Multilayer Optical Films Having Side-by-Side Polarizer/Polarizer Zones", PCT/US09/69192, and filed Dec. 22, 2009.

These multi-layer embodiments are very similar to the ones described above except that instead of each thermally activatable layer forming a color upon activation, at least one of the thermally activatable layers changes its reflective characteristic upon exposure to light of the write wavelength. In exemplary embodiments, modification of the reflective characteristics of the respective microlayer packets or other groups of interior layers is accomplished by reducing or eliminating a birefringence in at least some interior layers of the film by selective heating. The heating can be provided at least in part by directing a beam of light at the multi-layer optical film, the beam of light comprising a write wavelength at which at least some of the interior layers of the multi-layer optical film are absorptive. In the x- and y- (in-plane) directions, the heating can be patternwise applied to selected in-plane areas or zones of the film by controlling the light beam as appropriate (e.g. via the scan speed and/or scan pattern, spot size and focus, fluence, pulse frequency and durations, etc.) so that only the selected in-plane areas or zones are activated by the light. In the z- (thickness) direction, the heating can be applied to different selected interior portions of the film by suitable design of the multi-layer optical film, in combination with suitable delivery characteristics of the directed light beam, as described previously. In at least some cases, the internal patterning can be accomplished without any selective application of pressure to the film, and without any significant thinning of the film.

The selective birefringence reduction can be performed by the judicious delivery of an appropriate amount of energy to a selected in-plane zone so as to selectively heat some of the interior layers therein to a temperature high enough to produce a relaxation in the material that reduces or eliminates a preexisting optical birefringence, but low enough to maintain the physical integrity of the layer structure within the film. The reduction in birefringence may be partial or it may be complete, in which case some of the interior layers that are birefringent in a first (untreated) zone are rendered optically isotropic in a second (treated) zone.

As with the embodiments described above, each of the thermally activatable layers can be independently patterned or "written" using either the first or second write wavelength. The independent patterning can be facilitated by the blocking layer which at least partially blocks the write wavelength. Light of the write wavelengths may be delivered by lasers, for example. In some embodiments, the blocking layers are both reflective. In other embodiments, the blocking layers are both dependent on the polarization state of the incident light. In still other embodiments, one blocking layer is reflective and the other blocking layer is dependent upon the polarization state of the incident light.

Thus, a variety of methods can be used to generate an image in multi-layer articles of this disclosure. In some embodiments that articles have six layers, comprising four thermally activatable layers, and two blocking layers, as described above, where the first and third thermally activatable layers are closer to the light source, the second and fourth thermally activatable layers are farther from the light source and the first blocking layer is between the first and second thermally activatable layers and the second blocking layer is between the third and fourth activatable layers. At least one of the thermally activatable layers includes a light to heat convertor composition and a color changing compound. The article can be imaged by exposing the article to radiation of the first write wavelength and the proper configuration to pass through the first blocking layer and activate the second thermally activatable layer. By proper configuration to pass through the first blocking layer it is meant that the light is at the proper angle or polarization to pass through the blocking layer. The article can then be exposed to radiation of the first write wavelength and configuration to not pass through the first blocking layer and activate the first thermally activatable layer. It is also possible to activate the first thermally activatable layer first and then activate the second thermally activatable layer. Similarly the article can be further imaged by exposing the article to radiation of the second write wavelength and the proper configuration to pass through the second blocking layer and activate the fourth thermally activatable layer. The article can then be exposed to radiation of the second write wavelength and configuration to not pass through the second blocking layer and activate the third thermally activatable layer. In general, the four thermally activatable layers can be imaged in any sequence using these methods. As mentioned above, at least one of the thermally activatable layers includes a light to heat convertor composition and a color changing compound. Both of the thermally activatable layers may include a light to heat convertor composition and a color changing compound, or one of the thermally activatable layers may comprise a group of layers arranged to selectively reflect light by constructive or destructive interference to provide a first reflective characteristic, the group of layers also having a first absorption characteristic suitable to, upon exposure to light comprising the write wavelength, absorptively heat the first group of layers by an amount sufficient to change the first reflective characteristic to a second reflective characteristic while maintaining the structural integrity of the group of layers.

FIG. 1 shows an illustrative embodiment of an article of this disclosure. This embodiment, article 100, comprises six layers. The six layers are labeled 10, 20, 30, 40, 50, and 60. In some embodiments, layers 10, 20, 50 and 60 are thermally activatable layers and layers 30 and 40 are blocking layers. In some embodiments, layer 60 comprises a thermally activatable backing layer. Typically, thermally activatable layer 60 comprises a laser engravable backing layer that is white prior to laser engraving, but upon activation by laser light of the write frequency is selectively converted to black or gray. In some embodiments, layers 10, 20, and 50 are thermally activatable layers that comprise a thermally sensitive dye and a light to heat convertor. These layers may additionally include a variety of additional components such as binder agents, fixing agents, etc. In some embodiments, layers 10 and 50 are activated by a first write wavelength, and layer 30 is a blocking layer for that write wavelength, and layers 20 and 60 are activated by a second write wavelength and layer 40 is a blocking layer for that write wavelength. Typically, the absorption thresholds for layer 10 is higher than the absorption threshold for layer 50 and the absorption threshold for layer 20 is higher than the absorption threshold for layer 60.

Figure 2:
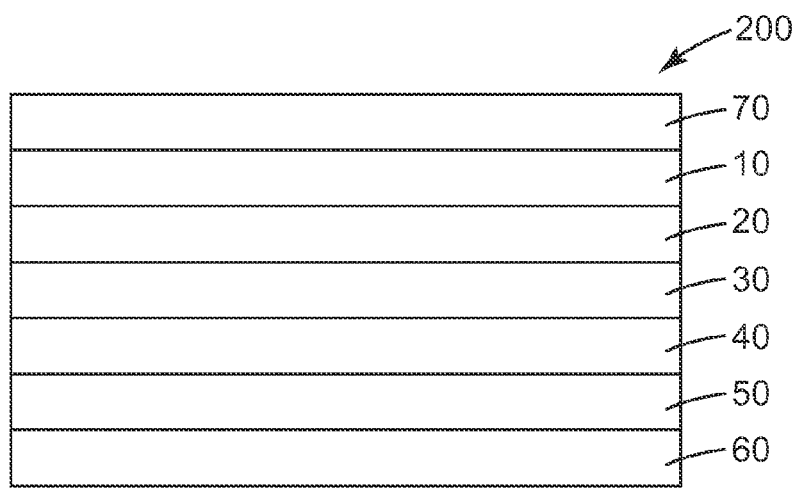
FIG. 2 shows a cross sectional view of a seven layer article of this disclosure.

FIG. 2 shows another illustrative embodiment of an article of this disclosure. This embodiment, article 200, has the same layers 10, 20, 30, 40, 50, and 60 as FIG. 1 and additionally includes cover layer 70 adjacent to layer 10. Layer 70 is not thermally activatable or a blocking layer and is suitable to protect layer 10, and the entire article, from damage, dirt and tampering.

Figure 3:
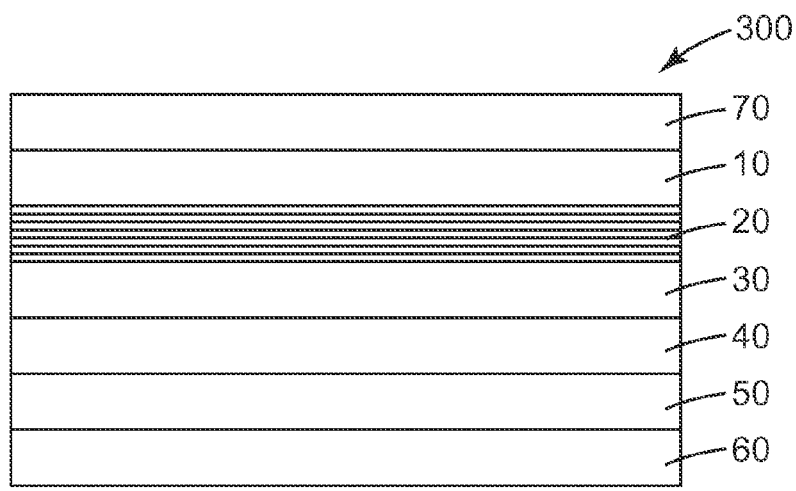
FIG. 3 shows a cross sectional view of a seven layer article of this disclosure.

FIG. 3 shows an alternative embodiment of the embodiment of FIG. 2. In this embodiment, article 300, layers 10, 30, 40, 50, 60, and 70 are the same as in FIG. 2, but layer 20 comprises a group of layers arranged to selectively reflect light by constructive or destructive interference to provide a first reflective characteristic, the group of layers also having a first absorption characteristic suitable to, upon exposure to light comprising the write wavelength, absorptively heat the first group of layers by an amount sufficient to change the first reflective characteristic to a second reflective characteristic while maintaining the structural integrity of the group of layers.

The multi-layer articles described above may be used to form a wide range of useful articles. Among the articles of this disclosure are, for example, a wide variety of identification documents (ID documents). The term "ID documents" is broadly defined and is intended to include, but not be limited to, for example, passports, driver's licenses, national ID cards, social security cards, voter registration and/or identification cards, birth certificates, police ID cards, border crossing cards, security clearance badges, security cards, visas, immigration documentation and cards, gun permits, membership cards, phone cards, stored value cards, employee badges, debit cards, credit cards, and gift certificates and cards. ID documents are also sometimes referred to as "security documents". The articles of this disclosure may be the ID document or may be part of the ID document. Other articles containing color images included in this disclosure include items of value, such as, for example, currency, bank notes, checks, and stock certificates, where authenticity of the item is important to protect against counterfeiting or fraud, as well as articles which can be used to produce informative, decorative, or recognizable marks or indicia on product tags, product packaging, labels, charts, maps and the like.

The articles of this disclosure are particularly useful in the formation of ID documents because they permit the formation of a color image that is contained within a multi-layer construction. The multi-layer construction provides for protection of the image from damage, environmental degradation and tampering.

EXAMPLES

These examples are merely for illustrative purposes only and are not meant to be limiting on the scope of the appended claims. All parts, percentages, ratios, etc. in the examples and the rest of the specification are by weight, unless noted otherwise. Solvents and other reagents used were obtained from Sigma-Aldrich Chemical Company; Milwaukee, Wis. unless otherwise noted.

| Table of Abbreviations | |
|---|---|
| Abbreviation or Trade Designation | Description |
| Dye-1 | A cyan-colored leuco dye, 10-benzoyl-N,N,N',N'-tetraethyl-10H-phenoxazine-3,7-diamine, prepared as described in German Pat. No. DE 2,237,833. |
| ATO | Antimony tin oxide, near IR pigment, $\lambda_{max}$ between 1000 and 1100 nm. |
| Binder-1 | PKHH, poly (bisphenol A epichlorohydrin) glycidyl end-capped copolymer with Mn 1,075. |
| Binder-2 | Polyvinyl alcohol, from Air Products & Chemicals, Allentown, PA |
| THF | Tetrahydrofuran |
| Dye-2 | yellow leuco dye, 2,6-di-tert-butyl-4-[5-(4-ethoxy-3-nitrophenyl)-4-phenyl-1H-imidazol-2-yl]-phenol, prepared as described below in Synthesis Example S1. |
| Dye-3 | magenta leuco dye prepared as described in U.S. Pat. No. 4,563,415. |
| LEBL | Laser Engravable Backing Layer. A thermally activatable film layer, typically white in color that turns black or gray upon selective laser engraving. |
| CFL-1 | Color Forming Layer-1. A thermally activatable film layer prepared by solvent blending in a suitable solvent such as THF, a dye, a light to heat convertor and a binder. |
| CFL-2 | Color Forming Layer-2. A thermally activatable film layer prepared by solvent blending in a suitable solvent such as THF, a dye, a light to heat convertor and a binder. |
| CFL-3 | Color Forming Layer-3. A thermally activatable film layer prepared by solvent blending in a suitable solvent such as THF, a dye, a light to heat convertor and a binder. |
| OCA | Optically Clear Adhesive, 3M 8141 OPTICALLY CLEAR ADHESIVE from 3M Company, St. Paul, MN. |
| B-1 | Blocking Layer-1, for use with a write wavelength of 808 nm, prepared as described in the Synthesis Example section below. |
| B-2 | Blocking Layer-2, for use with a write wavelength of 1064 nm, prepared as described in the Synthesis Example section below. |
| B-3 | Blocking Layer-3, for use with a write wavelength of 1064 nm, prepared as described in the Synthesis Example section below. |
| MLIF-1 | Multi-layer Interference Film-1, prepared as described in the Synthesis Example section below. |
| MLIF-2 | Multi-layer Interference Film-2, prepared as described in the Synthesis Example section below. |

Synthesis Example S1

Preparation of Yellow Leuco Dye Dye-2

Step 1: Preparation of 1-(4-ethoxyphenyl)-2-phenylethane-1,2-dione

The synthesis of 1-(4-ethoxyphenyl)-2-phenylethane-1,2-dione was carried out as described in Nelson, J. Leonard, Richard T. Rapala, Hershel L. Herzog and Elkan R. Blout; J. Am. Chem. Soc.; 71; 1949; 2997-2998. The synthesis is summarized by the equation:

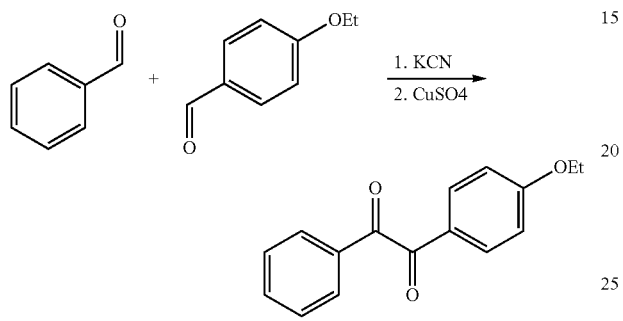

Step 2: Preparation of 1-(4-ethoxy-3-nitrophenyl)-2-phenylethane-1,2-dione

To 0.5 gram of 1-(4-ethoxyphenyl)-2-phenylethane-1,2-dione prepared in Step 1, was add 10 milliliters of concentrated nitric acid and the resulting mixture was heated to 110° C. for 2 hours. The reaction mixture was cooled and poured into 20 milliliters of water. The precipitate was recrystallized from ethanol to give 1-(4-ethoxy-3-nitrophenyl)-2-phenylethane-1,2-dione. The synthesis is summarized by the equation:

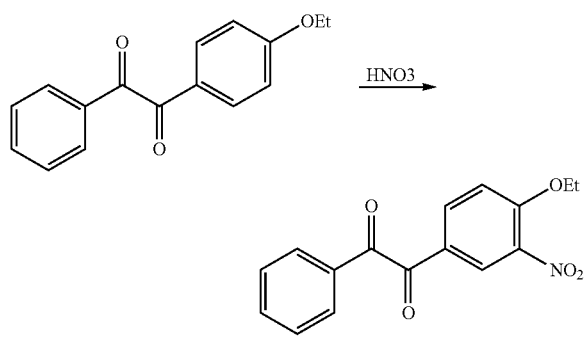

Step 3: Preparation of 2,6-di-tert-butyl-4-[5-(4-ethoxy-3-nitrophenyl)-4-phenyl-1H-imidazol-2-yl]-phenol A mixture of 10.8 grams if 3,5-di-tert-butyl-4-hydroxybenzaldehyde (commercially available from Alfa Aesar), 11.7 grams of 1-(4-ethoxy-3-nitrophenyl)-2-phenylethane-1, 2-dione (prepared in Step 2 above), and 27.5 grams of ammonium acetate in 200 milliliters of acetic acid was heated to reflux for 3 hours. The mixture was cooled and poured into water and the precipitate was collected by filtration and then air dried overnight to give 2,6-di-tert-butyl-4-[5-(4-ethoxy-3-nitrophenyl)-4-phenyl-1H-imidazol-2-yl]-phenol. The synthesis is summarized by the equation:

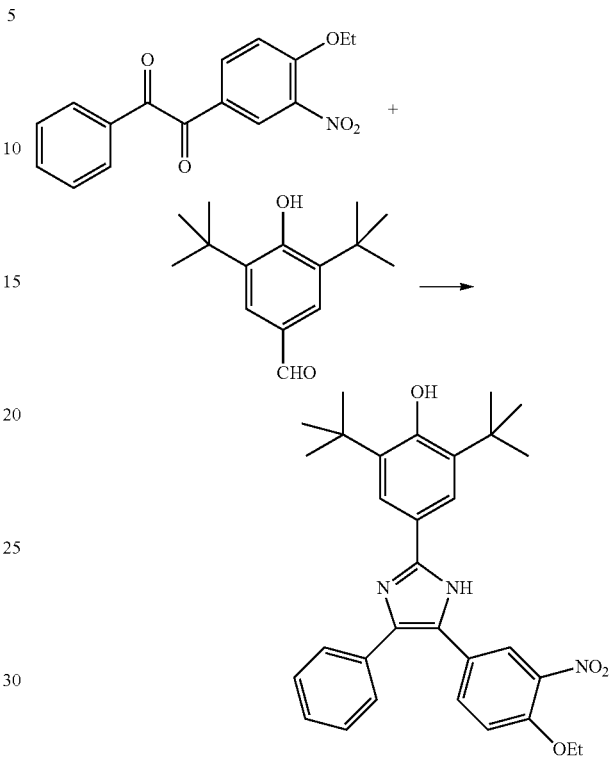

Synthesis Examples S2-S4

Preparation of Blocking Layers B-1-B-3

Near infra-red blocking layers suitable for use can be made by co-extrusion and orientation of multi-layer thermoplastic films in accord with the general methods described by U.S. Pat. No. 5,882,774 (Jonza et al.), U.S. Pat. No. 6,352,761 (Hebrink et al.) and U.S. Pat. No. 6,830,713 (Hebrink, et al.). Multilayer reflective polarizers, which block only one linear polarization of light, can be formed by drawing selected coextruded films in one direction (uniaxial drawing), while reflective mirrors which block both orthogonal linear polarizations of light, can be formed by drawing other selected coextruded films in two in-plane directions (biaxial drawing) as described therein.

Blocking layer B-1 was thus formed by co-extruding a so-called coPEN 55/45 with hexane diol substitution as described in Example 10 of U.S. Pat. No. 6,352,761 (Hebrink et al.) and coPEN 90/10 as described in Example 1 of U.S. Pat. No. 6,946,188. CoPEN 90/10 and coPEN 55/45 extruded and pumped through a melt train at 540° F. (282° C.) and 525° F. (274° C.) respectively, in a proportion of 10:9 on a weight basis, into a 275 layer feedblock set at 535° F. (279° C.). The coPEN90/10 stream also fed the protective boundary stream comprising about 20% of the coPEN 90/10 feed. The feedblock was equipped with a gradient plate with a block factor of 1.15 to create a layer pair thickness gradient through the thickness in this amount. The multilayer flow from the feedblock was combined with two additional co-extruded skin layers set at 540° F. (282° C.) comprising 90/10 coPEN. The skins thus comprised about 20% of the construction by weight. The combined stream was then cast from a die at 535° F. (279° C.) and electrostatically pinned onto a quenching wheel. The cast film was subsequently re-heated to 270° F. and drawn transversely in a conventional tenter to a draw ratio of approximately 5, and further heat set at a temperature of 300° F. (149° C.) for about 30 seconds. The transmission spectra of the resulting multilayer reflecting polarizer can be measured with a spectrophotometer to demonstrate that 85-90% of pass state light of 808 nm passes through the blocking layer while less than 2% of block state light of 808 nm passes through the blocking layer. An example of a suitable spectrophotometer is the Lambda 950 available from Perkin-Elmer.

Blocking layer B-2 was formed by making a similar film to B-1, only about 25% thicker. The transmission spectra of the resulting multilayer reflecting polarizer can again be measured with a spectrophotometer to demonstrate that 85-90% of pass state light of 1064 nm passes through the blocking layer while less than 1% of block state light of 1064 nm passes through the blocking layer.

Blocking layer B-3 can be made, e.g. in general accordance with Example 12 of U.S. Pat. No. 5,882,774, by using the narrow gradient feedblock of Examples B-1 and B-2 previously described. Other suitable materials are provided, e.g. in U.S. Pat. No. 6,830,713 (Hebrink, et al.). Blocking layer B-3 is thus a reflective mirror. It is anticipated that the blocking power of B-3 would be at least as strong as the block state of B-2, in both orthogonal states of polarization due to a larger difference in refractive index between layers. The reflection band would also be anticipated to be wider. Processing conditions that favor a sharp right band edge are preferred in order to allow a more consistent, robust treatment of films through the blocking layer at off-normal incidence. Further discussion of such conditions is provided, e.g. in U.S. Pat. No. 6,830,713 (Hebrink et al.) and U.S. Pat. No. 6,967,778 (Wheatley et al.).

Synthesis Examples S5-S6

Multi-Layer Interference Film Constructions MLIF-1 and MLIF-2

Suitable multilayer optical films capable of spatial tailoring, arranged to selectively reflect light by constructive or destructive interference, are described in the following commonly assigned applications: International Application No. PCT/US2009/069153, "Internally Patterned Multilayer Optical Films Using Spatially Selective Birefringence Reduction", filed Dec. 22, 2009; International Application No. PCT/US2009/069120, "Multilayer Optical Films Having Side-by-Side Mirror/Polarizer Zones", filed Dec. 22, 2009; International Application No. PCT/US2009/069173, "Multilayer Optical Films Suitable for Bi-Level Internal Patterning", filed Dec. 22, 2009; International Application No. PCT/US2009/069160, "Internally Patterned Multilayer Optical Films With Multiple Birefringent Layers", filed Dec. 22, 2009; and International Application No. PCT/US2009/069192, and "Multilayer Optical Films Having Side-by-Side Polarizer/Polarizer Zones", filed Dec. 22, 2009; U.S. Application 61/360,127.

Of particular interest are films are MLIF-1, similar to multilayer film 6 (writable at 808 nm) and MLIF-2, multilayer film 7 (writable at 1064 nm), and their patterned (written) films resulting in magenta and yellow transmitted colors (green and blue reflection bands) respectively, described in the examples section of International Application No. PCT/US2009/069160, "Internally Patterned Multilayer Optical Films With Multiple Birefringent Layers", filed Dec. 22, 2009. Other suitable films include nearly identical films to these example, that substantially vary only by their thicknesses and thus also their reflective color bands; for example, films tuned in thickness to reflect blue, green, yellow or red light at normal incidence, and thus also transmit the apparent colors of yellow, magenta, purple or cyan, respectively, as might be perceived from viewing the films on a white background. Also of particular interest are variations of these films where the concentration of light-to-heat convertors are varied.

Examples 1-4

Six layer articles can be made by preparing four thermally activatable layers and laminating a blocking layer between the thermally activatable layers. The layers are labeled Layer 1, Layer 2, Layer 3, Layer 4, Layer 5, and Layer 6, with Layer 6 being furthest from the light activation source. The identities of each of the layers is shown in Table 1. The thermally activatable layers can be a color forming layers. CFL-1 may be prepared from any of Dyes 1-3, CFL-2 may be prepared from any of Dyes 1-3, and CFL-3 can be prepared from any of Dyes 1-3 with the proviso that CFL-1, CFL-2 and CFL-3 are prepared with different dyes. The multilayer article can be prepared by coating CFL-3 on the LEBL and the solvent can be allowed to dry. The blocking layers can be laminated to the dried thermally activatable layer using an optically clear adhesive such as OCA. The blocking layers BL-1 and BL-2 can be any of B-1, B-2, B-3, with the proviso that BL-1 and BL-2 are different. CFL-1 and CFL-2 can for formed by coating the blend on a suitable substrate such as PET, polycarbonate, or polypropylene film, allowing the solvent to dry and laminating the dried layer to the formed construction or by coating the solvent blend on the blocking layer and allowing the solvent to dry to form the color forming layer. A cover layer can be laminated over Layer 1 to form a seven layer construction. The cover layer can be PET, polycarbonate, or a polyolefin film.

TABLE 1

| Example | Layer 1 | Layer 2 | Layer 3 | Layer 4 | Layer 5 | Layer 6 |
|---------|---------|---------|---------|---------|---------|---------|
| 1 | CFL-1 | CFL-2 | BL-1 | BL-2 | CFL-3 | LEBL |
| 2 | CFL-2 | CFL-1 | BL-1 | BL-2 | CFL-3 | LEBL |
| 3 | CFL-2 | CFL-1 | BL-2 | BL-1 | CFL-3 | LEBL |
| 4 | CFL-1 | CFL-2 | BL-2 | BL-1 | CFL-3 | LEBL |

Examples 5-24

Six layer articles can be made by preparing four thermally activatable layers and laminating a blocking layer between the thermally activatable layers. The layers are labeled Layer 1, Layer 2, Layer 3, Layer 4, Layer 5, and Layer 6, with Layer 6 being furthest from the light activation source. The identity of each of the layers is shown in Table 2. The thermally activatable layers can be a color forming layers or a group of layers arranged to selectively reflect light by constructive or destructive interference (MLIF contructions). CFL-1 may be prepared from any of Dyes 1-3, CFL-2 may be prepared from any of Dyes 1-3, and CFL-3 can be prepared from any of Dyes 1-3 with the proviso that CFL-1, CFL-2 and CFL-3 are prepared with different dyes. The multilayer article can be prepared by coating CFL-3 on the LEBL and the solvent can be allowed to dry. The blocking layers can be laminated to the thermally activatable layer using an optically clear adhesive such as OCA. The blocking layers BL-1 and BL-2 can be any of B-1, B-2 or B-3, with the proviso that BL-1 and BL-2 are different. CFL-1 and CFL-2 can for formed by coating the blend on a suitable substrate such as PET, polycarbonate, or polypropylene film, allowing the solvent to dry and laminating the dried layer to the formed construction or by coating the solvent blend on the blocking layer and allowing the solvent to dry to form the color forming layer. A cover layer can be laminated over Layer 1 to form a seven layer construction. The cover layer can be PET, polycarbonate, or a polyolefin film.

TABLE 2

| Example | Layer 1 | Layer 2 | Layer 3 | Layer 4 | Layer 5 | Layer 6 |
|---|---|---|---|---|---|---|
| 5 | CFL-1 | CFL-2 | BL-1 | BL-2 | MLIF-1 | LEBL |
| 6 | CFL-2 | CFL-1 | BL-1 | BL-2 | MLIF-1 | LEBL |
| 7 | CFL-2 | CFL-1 | BL-2 | BL-1 | MLIF-1 | LEBL |
| 8 | CFL-1 | CFL-2 | BL-2 | BL-1 | MLIF-1 | LEBL |
| 9 | CFL-1 | CFL-2 | BL-1 | BL-2 | MLIF-2 | LEBL |
| 10 | CFL-2 | CFL-1 | BL-1 | BL-2 | MLIF-2 | LEBL |
| 11 | CFL-2 | CFL-1 | BL-2 | BL-1 | MLIF-2 | LEBL |
| 12 | CFL-1 | CFL-2 | BL-2 | BL-1 | MLIF-2 | LEBL |
| 13 | CFL-1 | MLIF-1 | BL-1 | BL-2 | MLIF-2 | LEBL |
| 14 | CFL-2 | MLIF-1 | BL-1 | BL-2 | MLIF-2 | LEBL |
| 15 | MLIF-1 | CFL-1 | BL-2 | BL-1 | MLIF-2 | LEBL |
| 16 | MLIF-1 | CFL-2 | BL-2 | BL-1 | MLIF-2 | LEBL |
| 17 | CFL-1 | CFL-2 | BL-1 | BL-2 | CFL-3 | MLIF-1 |
| 18 | CFL-2 | CFL-1 | BL-1 | BL-2 | CFL-3 | MLIF-1 |
| 19 | CFL-2 | CFL-1 | BL-2 | BL-1 | CFL-3 | MLIF-1 |
| 20 | CFL-1 | CFL-2 | BL-2 | BL-1 | CFL-3 | MLIF-1 |
| 21 | CFL-2 | CFL-1 | BL-1 | BL-2 | MLIF-1 | MLIF-2 |
| 22 | CFL-2 | CFL-1 | BL-2 | BL-1 | MLIF-1 | MLIF-2 |
| 23 | CFL-1 | CFL-2 | BL-2 | BL-1 | MLIF-1 | MLIF-2 |
| 24 | CFL-1 | CFL-2 | BL-1 | BL-2 | MLIF-2 | MLIF-2 |

What is claimed is:

1. A multi-layer article comprising:
a first, interior, thermally activatable layer, wherein the first thermally activatable layer comprises a first light to heat convertor composition and a first color changing compound, and wherein the light to heat convertor composition absorbs light of a first write wavelength and the first activatable layer has a first absorption threshold for activation;
a second, interior, thermally activatable layer, wherein the second thermally activatable layer comprises a second light to heat convertor composition and a second color changing compound and wherein the light to heat convertor composition absorbs light of the first write wavelength and the second activatable layer has a second absorption threshold for activation, wherein the second absorption threshold is lower than the first absorption threshold; and
a first blocking layer disposed between the first and second internal thermally activatable layers, the first blocking layer being adapted to at least partially block but not completely block light of the first write wavelength; and
a third, interior, thermally activatable layer, wherein the third thermally activatable layer comprises a third light to heat convertor composition and a third color changing compound, and wherein the third light to heat convertor composition absorbs light of a second write wavelength and the third activatable layer has a third absorption threshold for activation;
a fourth, interior, thermally activatable layer, wherein the fourth thermally activatable layer comprises a fourth light to heat convertor composition and a fourth color changing compound and wherein the fourth light to heat convertor composition absorbs light of the second write wavelength and the fourth activatable layer has a fourth absorption threshold for activation, wherein the fourth absorption threshold is lower than the third absorption threshold; and
a second blocking layer disposed between the third and fourth internal thermally activatable layers and adjacent the first blocking layer, the second blocking layer being adapted to at least partially block but not completely block light of the second write wavelength.

2. The multi-layer article of claim 1, comprising a first thermally activatable zone, wherein the first thermally activatable zone comprises the first blocking layer that blocks light of the first write wavelength such that a first beam of light comprising the first write wavelength can be directed at the article to overcome the first absorption threshold without overcoming the second absorption threshold and wherein the first blocking layer blocks light of the first write wavelength such that a second beam of light comprising the first write wavelength can be directed at the article to overcome the second absorption threshold without overcoming the first absorption threshold.

3. The multi-layer article of claim 1, comprising a second thermally activatable zone, wherein the second thermally activatable zone comprises the second blocking layer that blocks light of the second write wavelength such that a third beam of light comprising the second write wavelength can be directed at the article to overcome the third absorption threshold without overcoming the fourth absorption threshold and wherein the second blocking layer blocks light of the second write wavelength such that a fourth beam of light comprising the second write wavelength can be directed at the article to overcome the fourth absorption threshold without overcoming the third absorption threshold.

4. The multi-layer article of claim 3, wherein the second blocking layer comprises a polarization layer with a pass state and the third beam of light comprising the second write wavelength comprises polarized light with a polarization state perpendicular to that of the pass state of the second blocking layer and the fourth beam of light comprising the second write wavelength comprises polarized light with a polarization state parallel to the pass state of the second blocking layer.

5. The multi-layer article of claim 3, wherein the second blocking layer comprises a reflective layer and the third beam of light comprising the second write wavelength comprises light of normal incidence and the fourth beam of light comprising the second write wavelength comprises light of off-normal incidence.

6. The multi-layer article of claim 1, wherein at least one of the first blocking layer and the second blocking layer comprises a polarization layer with a pass state.

7. The multi-layer article of claim 1, wherein at least one of the first blocking layer and the second blocking layer comprises a reflective layer.

8. The multi-layer article of claim 1, wherein at least one of the first light to heat convertor composition, the second light to heat convertor composition, the third light to heat convertor composition and the fourth light to heat convertor composition comprises a non-linear light to heat convertor composition.

9. The multi-layer article of claim 1, wherein at least one of the first light to heat convertor composition, the second light to heat convertor composition, the third light to heat convertor composition and the fourth light to heat convertor composition comprises a linear light to heat convertor composition.

10. The multi-layer article of claim 1, wherein at least one of the first color changing compound, the second color changing compound, the third color changing compound and the fourth color changing compound comprises a leuco dye.

11. The multi-layer article of claim 10, wherein the leuco dye comprises an oxazine, a diazine, a thiazine, a fluorescein, a rhodamine, a rhodol, a ketazine, a xanthene, a thiolactone-based leuco dye, a barbituric acid leuco dye, a thiobarbituric acid leuco dye or combination thereof.

12. The multi-layer article of claim 1, wherein each of the first color changing compound, the second color changing compound, the third color changing compound, and the fourth color changing compound form different colors upon thermal activation.

13. A multi-layer article comprising:
- a first, interior, thermally activatable layer, wherein the first thermally activatable layer absorbs light of a first write wavelength and the first activatable layer has a first absorption threshold for activation;
- a second, interior, thermally activatable layer, wherein the second thermally activatable layer absorbs light of the first write wavelength and the second activatable layer has a second absorption threshold for activation, wherein the second absorption threshold is lower than the first absorption threshold; and
- a first blocking layer disposed between the first and second internal thermally activatable layers, the first blocking layer being adapted to at least partially block but not completely block light of the first write wavelength; and
- a third, interior, thermally activatable layer, wherein the third thermally activatable layer absorbs light of a second write wavelength and the third activatable layer has a third absorption threshold for activation;
- a fourth, interior, thermally activatable layer, wherein the fourth thermally activatable layer absorbs light of the second write wavelength and the fourth activatable layer has a fourth absorption threshold for activation, wherein the fourth absorption threshold is lower than the third absorption threshold; and
- a second blocking layer disposed between the third and fourth internal thermally activatable layers and adjacent the first blocking layer, the second blocking layer being adapted to at least partially block but not completely block light of the second write wavelength; and
- wherein at least one of the first, second, third or fourth activation layers comprises a light to heat convertor composition and a color changing compound, and at least one of the first, second, third or fourth activation layers comprises a group of layers arranged to selectively reflect light by constructive or destructive interference to provide a first reflective characteristic, the group of layers also having a first absorption characteristic suitable to, upon exposure to light comprising the write wavelength, absorptively heat the first group of layers by an amount sufficient to change the first reflective characteristic to a second reflective characteristic while maintaining the structural integrity of the group of layers.

14. The multi-layer article of claim 13, comprising a first thermally activatable zone, wherein the first thermally activatable zone comprises a first blocking layer that blocks light of the first write wavelength such that a first beam of light comprising the first write wavelength can be directed at the article to overcome the first absorption threshold without overcoming the second absorption threshold and wherein the first blocking layer blocks light of the first write wavelength such that a second beam of light comprising the first write wavelength can be directed at the article to overcome the second absorption threshold without overcoming the first absorption threshold.

15. The multi-layer article of claim 13, comprising a second thermally activatable zone, wherein the second thermally activatable zone comprises a second blocking layer that blocks light of the second write wavelength such that a third beam of light comprising the second write wavelength can be directed at the article to overcome the third absorption threshold without overcoming the fourth absorption threshold and wherein the second blocking layer blocks light of the second write wavelength such that a fourth beam of light comprising the second write wavelength can be directed at the article to overcome the fourth absorption threshold without overcoming the third absorption threshold.

16. The multi-layer article of claim 13, wherein at least one of the first blocking layer and the second blocking layer comprises a polarization layer with a pass state.

17. The multi-layer article of claim 13, wherein at least one of the first blocking layer and the second blocking layer comprises a reflective layer.

18. The multi-layer article of claim 13, wherein the article comprises an identification document.

19. A method of generating an image, comprising:
providing a multi-layer article comprising:
- a first, interior, thermally activatable layer, wherein the first thermally activatable layer absorbs light of a first write wavelength and the first activatable layer has a first absorption threshold for activation;
- a second, interior, thermally activatable layer, wherein the second thermally activatable layer absorbs light of the first write wavelength and the second activatable layer has a second absorption threshold for activation, wherein the second absorption threshold is lower than the first absorption threshold;
- a first blocking layer disposed between the first and second internal thermally activatable layers, the first blocking layer being adapted to at least partially block but not completely block light of the first write wavelength;
- a third, interior, thermally activatable layer, wherein the third thermally activatable layer absorbs light of a second write wavelength and the third activatable layer has a third absorption threshold for activation;
- a fourth, interior, thermally activatable layer, wherein the fourth thermally activatable layer absorbs light of the second write wavelength and the fourth activatable layer has a fourth absorption threshold for activation, wherein the fourth absorption threshold is lower than the third absorption threshold;
- a second blocking layer disposed between the third and fourth internal thermally activatable layers and adjacent the first blocking layer, the second blocking layer being adapted to at least partially block but not completely block light of the second write wavelength;
- wherein at least one of the first, second, third and fourth activation layers comprise a light to heat convertor composition and a color changing compound;
exposing the multi-layer article to radiation of the first write wavelength and the proper configuration to pass through the first blocking layer to activate the second thermally activatable layer;
exposing the multi-layer article to radiation of the first write wavelength and the configuration to not pass through the first blocking layer to activate the first thermally activatable layer;

exposing the multi-layer article to radiation of the second write wavelength and the proper configuration to pass through the second blocking layer to activate the fourth thermally activatable layer; and exposing the multi-layer article to radiation of the second write wavelength and the configuration to not pass through the second blocking layer to activate the third thermally activatable layer.

\* \* \* \* \*